(12) United States Patent
Nagarkar et al.

(10) Patent No.: US 10,333,493 B2
(45) Date of Patent: Jun. 25, 2019

(54) EMBEDDED RF FILTER PACKAGE STRUCTURE AND METHOD OF MANUFACTURING THEREOF

(71) Applicant: General Electric Company, Schenectady, NY (US)

(72) Inventors: Kaustubh Ravindra Nagarkar, Clifton Park, NY (US); Yongjae Lee, Latham, NY (US); Christopher James Kapusta, Delanson, NY (US)

(73) Assignee: General Electric Company, Schenectady, NY (US)

( * ) Notice: Subject to any disclaimer, the term of this patent is extended or adjusted under 35 U.S.C. 154(b) by 148 days.

(21) Appl. No.: 15/246,671

(22) Filed: Aug. 25, 2016

(65) Prior Publication Data

US 2018/0062618 A1     Mar. 1, 2018

(51) Int. Cl.
*H03H 9/64*     (2006.01)
*H03H 9/72*     (2006.01)
(Continued)

(52) U.S. Cl.
CPC .............. *H03H 9/54* (2013.01); *H03H 3/02* (2013.01); *H03H 9/0547* (2013.01);
(Continued)

(58) Field of Classification Search
CPC .......... H03H 9/64; H03H 9/72; H03H 9/0585; H03H 9/059; H03H 9/0595
(Continued)

(56) References Cited

U.S. PATENT DOCUMENTS 5,920,142 A    7/1999  Onishi et al.
6,969,945 B2*  11/2005 Namba ................. H01L 21/568
                                                     310/313 R
(Continued)

FOREIGN PATENT DOCUMENTS

EP    1 892 831 A1    2/2008
EP    2 107 599 A2    10/2009

OTHER PUBLICATIONS

Fisher et al., "High Frequency, Low Cost, Power Packaging Using Thin Film Power Overlay Technology", Applied Power Electronics Conference and Exposition, 1995, APEC '95, Conference Proceedings 1995, Tenth Annual, vol. 1, pp. 12-17, Mar. 5-9, 1995, Dallas, TX.
(Continued)

*Primary Examiner* — Dean O Takaoka
(74) *Attorney, Agent, or Firm* — Ziolkowski Patent Solutions Group, SC

(57) ABSTRACT

A filter package and method of manufacturing thereof is disclosed. The filter device package includes a first dielectric layer having an acoustic wave filter device attached thereto, the acoustic wave filter device comprising an active area and I/O pads. The filter device package also includes an adhesive positioned between the first dielectric layer and the acoustic wave filter device to secure the layer to the device, vias formed through the first dielectric layer and the adhesive to the I/O pads of the acoustic wave filter device, and metal interconnects formed in the vias and mechanically and electrically coupled to the I/O pads of the acoustic wave filter device to form electrical interconnections thereto, wherein an air cavity is formed in the adhesive between the acoustic wave filter device and the first dielectric layer, in a location adjacent the active area of the acoustic wave filter device.

19 Claims, 7 Drawing Sheets

(51) Int. Cl.
  *H03H 9/54* (2006.01)
  *H03H 3/02* (2006.01)
  *H03H 9/05* (2006.01)
  *H03H 9/10* (2006.01)

(52) U.S. Cl.
  CPC ........ *H03H 9/1042* (2013.01); *H03H 9/1071* (2013.01); *H03H 9/1085* (2013.01); *H03H 9/64* (2013.01); *H01L 2224/18* (2013.01)

(58) Field of Classification Search
  USPC ........................................................ 333/193
  See application file for complete search history.

(56) References Cited

U.S. PATENT DOCUMENTS

| | | | |
|---|---|---|---|
| 7,307,331 | B2 | 12/2007 | Kipnis et al. |
| 7,307,369 | B2* | 12/2007 | Yokota ...................... H03H 3/08 310/313 R |
| 7,982,364 | B2* | 7/2011 | Takayama ............ H03H 9/1092 310/313 A |
| 8,114,712 | B1 | 2/2012 | McConnelee et al. |
| 8,358,000 | B2 | 1/2013 | Beaupre et al. |
| 8,653,635 | B2 | 2/2014 | Gowda et al. |
| 8,872,328 | B2 | 10/2014 | Delgado et al. |
| 8,900,931 | B2 | 12/2014 | Liang |
| 2002/0173080 | A1 | 11/2002 | Saia et al. |
| 2006/0290238 | A1* | 12/2006 | Ozaki .................. H03H 9/1078 310/340 |
| 2008/0217708 | A1 | 9/2008 | Reisner et al. |
| 2016/0079957 | A1 | 3/2016 | Kikuchi et al. |
| 2016/0301386 | A1* | 10/2016 | Iwamoto .................. H03H 9/54 |

OTHER PUBLICATIONS

Ozmat et al., "A New Power Module Packaging Technology for Enhanced Thermal Performance", Thermal and Thermomechanical Phenomena in Electronic Systems, 2000, ITHERM 2000. The Seventh Intersociety Conference on, vol. 2, pp. 287-296, 2000, Las Vegas, NV.

Kim et al., "Design and Characterization of Wafer Level SAW Filter Package Using LT-LT Wafer Structure", Electronic Materials and Packaging, 2006, EMAP 2006, International Conference on, pp. 1-5, Dec. 11-14, 2006, Kowloon.

Aigner, R., "SAW, BAW and the future of wireless," Retrieved from the Internet URL: http://www.edn.com/design/wireless-networking/4413442/SAW-BAW-and-the-future-of-wireless, on Mar. 27, 2018, pp. 1-7 (May 6, 2013).

Extended European Search Report and Opinion issued in connection with corresponding EP Application No. 17185594.3 dated Jan. 3, 2018.

* cited by examiner

EMBEDDED RF FILTER PACKAGE STRUCTURE AND METHOD OF MANUFACTURING THEREOF

BACKGROUND OF THE INVENTION

Embodiments of the invention relate generally to structures and methods for packaging RF filters such as surface acoustic wave (SAW) filters, bulk acoustic wave (BAW) filters and SAW resonators and, more particularly, to an embedded package structure having one or more SAW filters, BAW filters and/or SAW resonators integrated therein.

RF interference has always been an inhibitor of communications, requiring designers to take such interference into account when designing devices that employ wireless communication. In addressing issues of RF interference, today's wireless devices must not only reject signals from other services but from themselves, too, as the number of bands packed inside each device increases. A high-end smartphone or tablet must, for example, filter the transmit and receive paths for 2G, 3G, and 4G wireless access methods in up to 15 bands, as well as Wi-Fi, Bluetooth and the receive path of GPS receivers.

As part of the filtering process, signals in the receive paths must be isolated from one another and other extraneous signals must also be rejected. In order to provide adequate filtering, the wireless device must thus employ one or more RF filters for each frequency band allowed for consumer mobile communication. As there are more than a half dozen frequency bands utilized for communication, it is thus common for the wireless device to require the use of several tens of filters, thus resulting in packing density challenges. These filters are typically in the form of surface acoustic wave (SAW) filters, bulk acoustic wave (BAW) filters, or SAW resonators. In a basic SAW filter 100, such as illustrated in FIG. 1, an electrical input signal is provided to SAW filter via electrical ports (i.e., I/O pads) 102, with the electrical input signal being converted to an acoustic wave by interleaved metal interdigital transducers (IDTs) 104 created on a piezoelectric substrate 106, such as quartz, lithium tantalite (LiTaO3) or lithium niobate (LiNbO3). SAW filters combine low insertion loss with good rejection and can achieve broad bandwidths with SAW filters being well suited for up to about 1.5 GHz such that they are often used in 2G receiver front ends and in duplexers and receive filters. In a basic BAW filter 110, such as illustrated in FIG. 2, metal patches 112, 114 are formed/provided on top and bottom sides of a quartz crystal substrate 116 to excite acoustic waves responsive to an electrical input signal provided thereto via electrical ports 118, with the acoustic waves bouncing from the top to bottom surface (i.e., propagate vertically) to form a standing acoustic wave. The frequency at which resonance occurs is determined by the thickness of the substrate 116 and the mass of the electrodes 112, 114, with BAW filters being well suited for high frequency applications such that they are often used in 3G and 4G applications.

In existing wireless devices, each RF filter (i.e., each SAW/BAW filter/SAW resonator) included in the device is assembled separately into its own ceramic, metal sealed package—with such packaging being necessary because the acoustic wave in the SAW filter often propagates along or very near the surface, such that the SAW filter is generally very sensitive to surface conditions and requires protection. FIGS. 3A to 3E illustrate a stepwise conventional fabrication technique of a SAW filter chip package. With reference to FIG. 3A, a wafer (not shown) having plural SAW filter chips is divided into individual SAW filter chips 120, and a substrate 122 having plural mounting portions corresponding to SAW filter chips 120 is provided. Protectors 124 are attached to a lower side of the SAW filter chip 120 to form an air gap for protecting the surface of the SAW filter 120, and bumps 126 for flip chip bonding are attached to an upper side of the substrate 122.

Referring to FIG. 3B, each SAW filter chip 120 is mounted on a mounting portion of the substrate 122, and the SAW filter chip is electrically and mechanically connected to a wiring portion of the substrate 122 by flip chip bonding. In alternative embodiments, it is recognized that the SAW filter chip 120 could also be wire bonded to connections on the substrate 122. As shown in FIG. 3C, underfills 128 are then filled into a space between the substrate and the SAW filter chip. When underfills 128 are filled between the substrate 122 and the SAW filter chip 120, an active region positioned on a lower side surface of the SAW filter chip 120 is protected by the air gap formed by protectors 124.

Referring to FIG. 3D, fillets 130 are formed in order to improve step-coverages of sides of SAW filter chips. Fillets 130 are composed of an insulating material, and give a gentle slope to sides of the SAW filter chip 120 having the form of a stepped pyramid, so that a metal layer can be easily formed on the SAW filter chip. After the fillet 130 is formed, a metal shield layer 132 is formed on the outer wall of the SAW filter chip 120, as shown in FIG. 3E. To secure reliability of the SAW filter chip 120, an inner metal layer intercepting external electrical effects is formed on an upper side of the chip, and then an outer metal layer for preventing oxidation of the inner metal layer owing to exposure of the inner metal layer to the atmosphere is additionally formed on the inner metal layer.

As described above, according to a conventional method for fabricating SAW filter chip packages, SAW filter chips are packaged as individual chip units. That is to say, after plural chips on a wafer are divided into individual chips, each chip is mounted on a package substrate, electrically connected thereto via flip chip or wire bonding, an underfill material is provided to a space between each SAW filter chip and the package substrate, and the step of forming fillets or metal shield layers are conducted for individual chip unit. Accordingly, a method for fabricating SAW filter chip packages is very complicated and may require a certain amount of space clearance for bonding wire to connections of the package. Furthermore, as many filter packages are often assembled into a multi-chip module that also includes discrete components, the resulting modules may be large in size and expensive.

Therefore, it would be desirable to provide a method of forming a filter package that reduces the complexity and cost of fabrication. It would further be desirable for such a method to allow for formation of a filter package as part of an overall embedded filter module that also includes peripheral passive components, delay lines, antennas and switching matrices in the same package, with such co-packaging of all the components in one structure providing for lower cost plastic packaging, lower form factor, and higher integration, and packing density.

BRIEF DESCRIPTION OF EMBODIMENTS OF THE INVENTION

Embodiments of the invention are directed to a filter package and method of manufacturing thereof that allows for formation of a filter package as part of an overall embedded filter module that also includes peripheral passive components, delay lines, antennas and switching matrices in the same package. The co-packaging of all the components in one structure provide for lower cost plastic packaging, lower form factor, and higher integration, and packing density.

In accordance with one aspect of the invention, a filter device package includes a first dielectric layer and an acoustic wave filter device attached to the first dielectric layer, the acoustic wave filter device comprising an active area and input/output (I/O) pads. The filter device package also includes an adhesive positioned between the first dielectric layer and the acoustic wave filter device to secure the first dielectric layer to the acoustic wave filter device, a plurality of vias formed through the first dielectric layer and the adhesive to the I/O pads of the acoustic wave filter device, and metal interconnects formed in the plurality of vias and mechanically and electrically coupled to the I/O pads of the acoustic wave filter device to form electrical interconnections thereto, wherein an air cavity is formed in the adhesive between the acoustic wave filter device and the first dielectric layer, in a location adjacent the active area of the acoustic wave filter device.

In accordance with another aspect of the invention, a method of manufacturing an embedded filter device package includes providing an initial dielectric layer having an adhesive layer on one surface thereof, the adhesive layer having a cavity therein that is free of adhesive material. The method also includes placing an acoustic wave filter device onto the adhesive layer so as to secure the acoustic wave filter device to the initial dielectric layer, the acoustic wave filter device being placed on the adhesive layer such that an active area of the acoustic wave filter device is adjacent to and aligned with the cavity in the adhesive layer. The method further includes forming a plurality of vias through the initial dielectric layer and the adhesive layer at locations aligned with input/output (I/O) pads of the acoustic wave filter device and forming metal interconnects in the plurality of vias and down to the I/O pads of the acoustic wave filter device so as to form electrical interconnections to the acoustic wave filter device.

In accordance with yet another aspect of the invention, a multichip filter device module package includes a plurality of discrete packaged acoustic wave filter devices, each of the plurality of discrete packaged acoustic wave filter devices further including a first dielectric layer and an acoustic wave filter device attached to the first dielectric layer, the acoustic wave filter device comprising an active area and input/output (I/O) pads. Each of the discrete packaged acoustic wave filter devices also includes an adhesive positioned between the first dielectric layer and the acoustic wave filter device to secure the first dielectric layer to the acoustic wave filter device, a plurality of vias formed through the first dielectric layer and the adhesive to the I/O pads of the acoustic wave filter device, metal interconnects formed in the plurality of vias and mechanically and electrically coupled to the I/O pads of the acoustic wave filter device to form electrical interconnections thereto, and input/output (I/O) connections formed on the metal interconnects on an outward facing surface of the first dielectric layer, wherein an air cavity is formed in the adhesive between the acoustic wave filter device and the first dielectric layer, in a location adjacent the active area of the acoustic wave filter device. The multichip filter device module package also includes a circuit substrate on which each of the plurality of discrete packaged acoustic wave filter devices is mounted, the circuit substrate being electrically connected to the plurality of discrete packaged acoustic wave filter devices via the I/O connections thereon. The multichip filter device module package further includes an insulating substrate applied onto the circuit substrate and about the plurality of discrete packaged acoustic wave filter devices to embed the plurality of discrete packaged acoustic wave filter devices therein.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Figure 1:
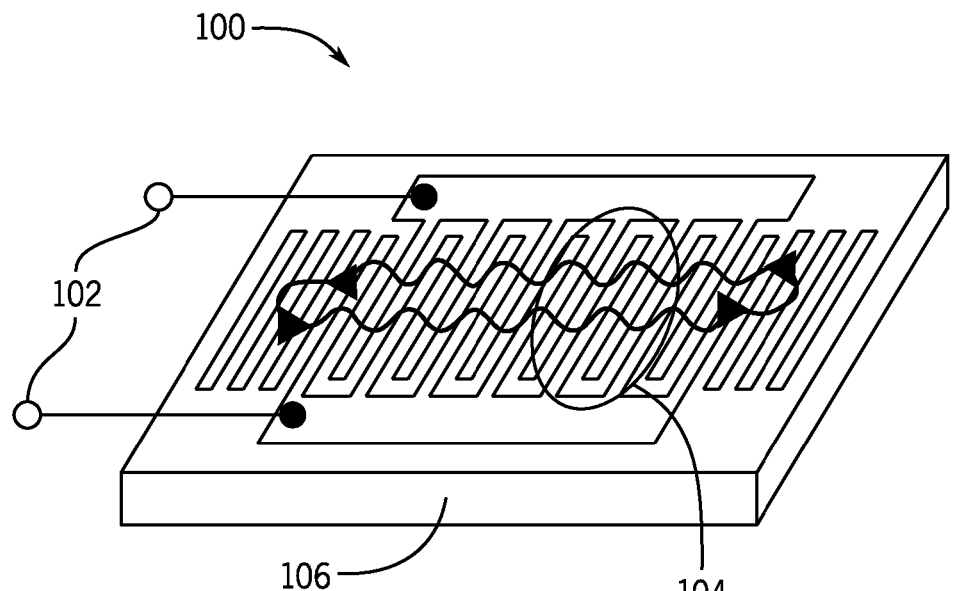
FIG. 1 is a schematic view of a SAW filter as known in the art.
Figure 2:
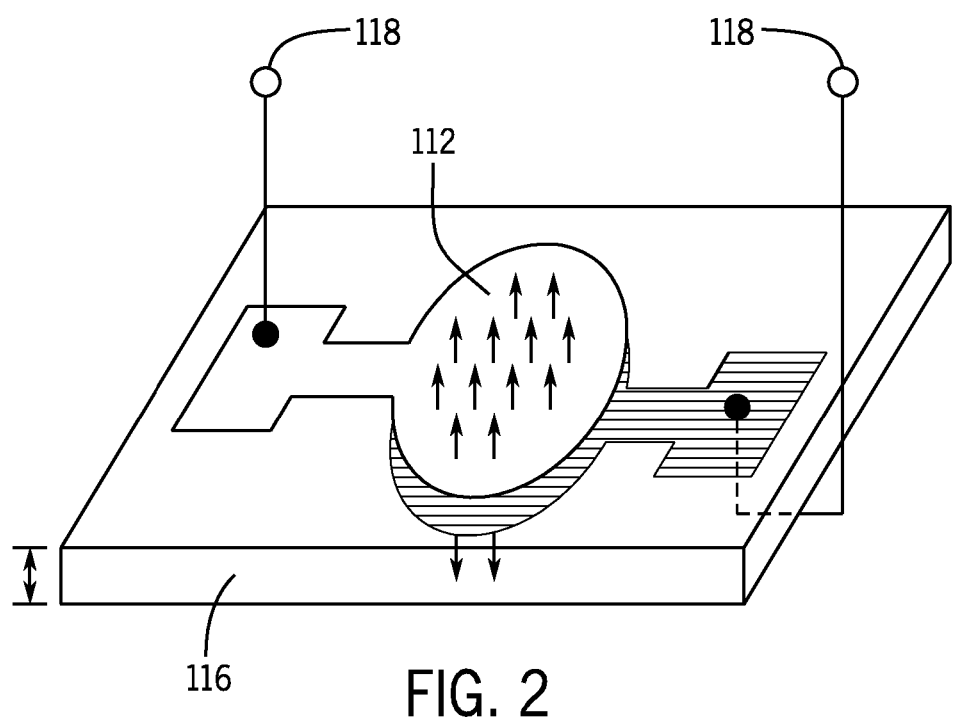
FIG. 2 is a schematic view of a BAW filter as known in the art.
Figure 3A:
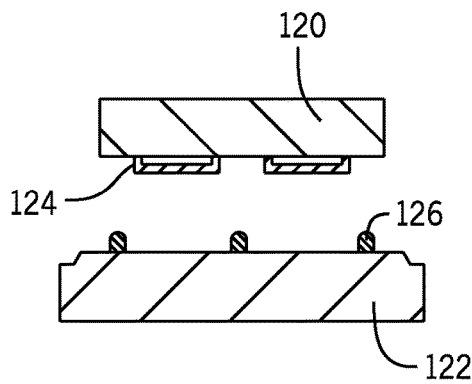
FIGS. 3A-3E are schematic cross-sectional views illustrating stepwise conventional fabrication of a SAW filter chip package as known in the art.
Figure 3B:
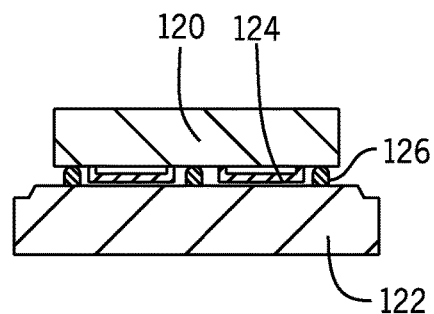
Figure 3C:
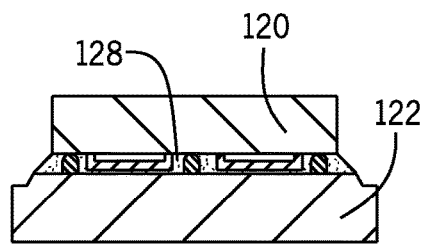
Figure 3D:
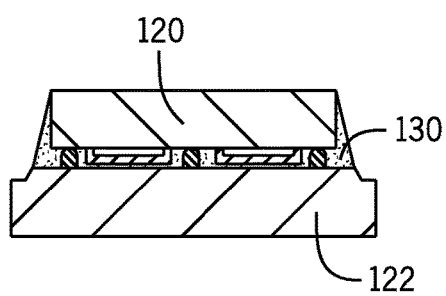
Figure 3E:
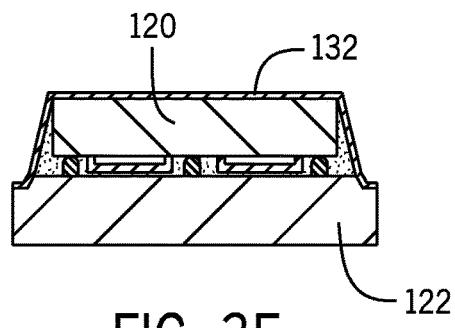
Figure 4:
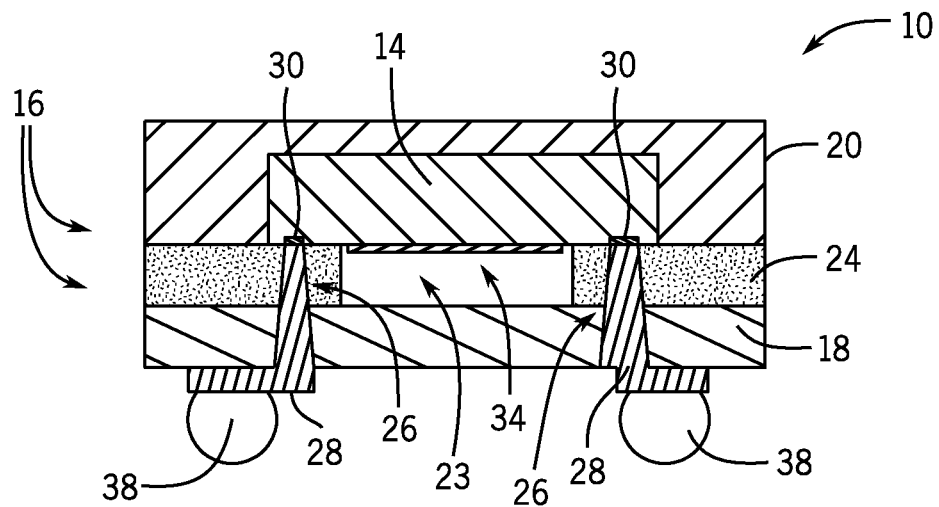
FIG. 4 is a schematic cross-sectional side view of a single, discrete SAW filter package according to an embodiment of the invention.
Figure 5:
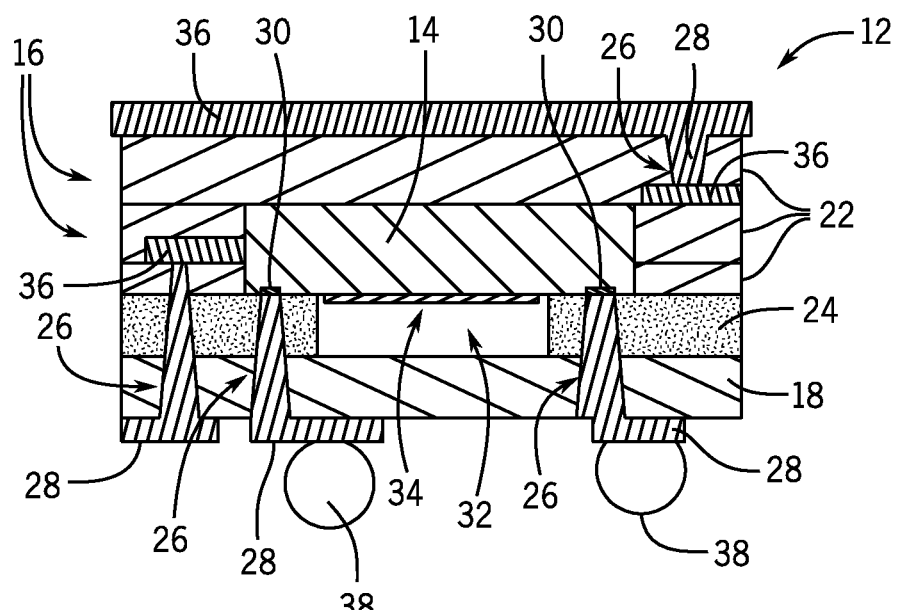
FIG. 5 is a schematic cross-sectional side view of a single, discrete SAW filter package according to another embodiment of the invention.

Referring to FIGS. 4 and 5, discrete embedded filter packages 10, 12 are shown according to embodiments of the invention. As shown in FIGS. 4 and 5, a single acoustic wave filter device 14 (i.e., RF filter) is included in package 10, 12 and is provided in an insulating substrate 16 of the package 10, 12, with the filter device 14 being embedded within the insulating substrate 16. According to embodiments of the invention, the filter device 14 in package may be in the form of a SAW filter or a BAW filter (such as shown in FIGS. 1 and 2). Thus, while hereafter filter device 14 is referred to as a SAW filter, it is recognized that the filter device in package 10, 12 could instead be in the form of a BAW filter.

In the embodiment of FIG. 4, the insulating substrate 16 is formed of an initial or first dielectric layer 18 provided in a self-supporting 'film', 'panel', or 'sheet' form, and a dielectric encapsulant 20. The dielectric layer 18 is formed of a material that is chosen to provide mechanical and temperature stability to vias during use and frame processing, as well as provide suitable dielectric properties and voltage breakdown strength and processability for via formation and power overlay (POL) processing. Accordingly, the dielectric layer 18 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material, according to embodiments of the invention. The dielectric encapsulant 20 may be formed of a polymeric encapsulant or epoxy, for example, that may be applied/formed so as to surround the SAW filter 14, so as to provide protection thereto and provide additional structural integrity to the packaged module 10.

In the embodiment of FIG. 5, the insulating substrate 16 is formed of a plurality of additional dielectric layers 22 provided in a 'film' or 'panel' or 'sheet' form, such that multiple dielectric layers 22 can be stacked on one another to a desired height/thickness, with adhesive (not shown) being provided between the additional layers as required in order to provide such stacking. Dielectric layer 18 is provided as an initial or first dielectric layer onto which SAW filter 14 is applied, and an additional number of dielectric layers 22 are then also applied. Similar to the embodiment of FIG. 4, the additional dielectric layers 22 are formed of a material that is chosen to provide mechanical and temperature stability to vias during use and frame processing, as well as provide suitable dielectric properties and voltage breakdown strength and processability for via formation and power overly (POL) processing. Accordingly, the dielectric layers 22 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material, according to embodiments of the invention.

In each of the embodiments of FIGS. 4 and 5, an adhesive material 24 (i.e., an "attachment adhesive") is included on the dielectric layer 18 for securing SAW filter 14 onto dielectric layer 18, with the SAW filter 14 being attached face down onto the adhesive 24 (with the IDTs or "active area" of SAW filter 14 being attached face down onto the adhesive 24). As shown in FIGS. 4 and 5, a plurality of vias 26 are formed through the dielectric layer 18 and adhesive 24 down to SAW filter 14. Metal interconnects 28 are subsequently formed/patterned in the package 10, 12 to provide electrical connections therein, with the interconnects 28 being formed in the vias 26 down to I/O pads 30 on the front surface of the SAW filter 14 and out onto a surface of dielectric layer 18. According to embodiments of the invention, the metal interconnects 28 comprise "POL interconnects" that are formed as robust electroplated copper interconnects that form direct electrical connections in the package 10, 12. Depending on the metallization on the device, in some embodiments, a sputtered adhesion layer (titanium, chromium, etc.) is provided along with a sputtered copper seed layer on which copper can be plated. The metal interconnects 28 are patterned and etched to a desired shape, such as to provide for electrical connections to SAW filter 14.

As shown in FIGS. 4 and 5, an air cavity or air gap 32 is provided in adhesive layer 24 adjacent the front surface of SAW filter 14. The air cavity 32 is necessary for optimal operation of the SAW filter 14 within package 10, 12, as the air cavity 32 allows for proper vibration and associated acoustic wave generation by the IDTs and the piezoelectric substrate (FIG. 1) of the SAW filter 14. According to one embodiment, the air cavity 32 is formed by application of a continuous layer of adhesive material 24 and a subsequent laser ablation of the adhesive in an area adjacent the active area (i.e., IDTs), generally indicated at 34, of the SAW filter 14 in order to form the air cavity 32. According to another embodiment, the air cavity 32 is formed via a selective application of adhesive material 24 onto dielectric layer 18, such as may be performed by an ink jet-type application of adhesive onto dielectric layer 18 such that no adhesive is applied in an area adjacent the active area 34 of the SAW filter 14 in order to form the air cavity 32.

In one embodiment, and as shown in FIG. 5, additional features 36 such as an antenna, delay lines, a switching matrix, and/or a shielding layer may be formed in package 12. Such features 36 may be formed via a metallization (e.g., sputtering) performed on/between one or more of the additional dielectric layers 22. Additional vias 26 and metal interconnects 28 are formed in dielectric layer 20 and dielectric layers 22 to provide electrical connections to the features 36 (as required), with such vias 26 and interconnects 28 being formed in a similar fashion as those formed to the SAW filter 14. As specifically shown in FIG. 5, a shielding layer 36 is formed on a surface of the outermost dielectric layer 22 to provide shielding to the package 12, with other features 36 embedded within the additional dielectric layers 22.

As further shown in FIGS. 4 and 5, input/output (I/O) connections 38 are provided on the metal interconnects 28 on the outer facing surface of dielectric layer 18. Such I/O connections 38 may be in the form of solder balls, for example, that provide for connection of the package 10, 12 to an external device, such as a printed circuit board (not shown), for example.

Thus, according to embodiments provided in FIGS. 4 and 5, SAW filter packages 10, 12 are provided that enable shorter path lengths, better grounding, and redundant interconnects, all resulting in superior RF performance (i.e., low insertion loss but high isolation) as compared to prior art SAW filter packages.

Figure 9:
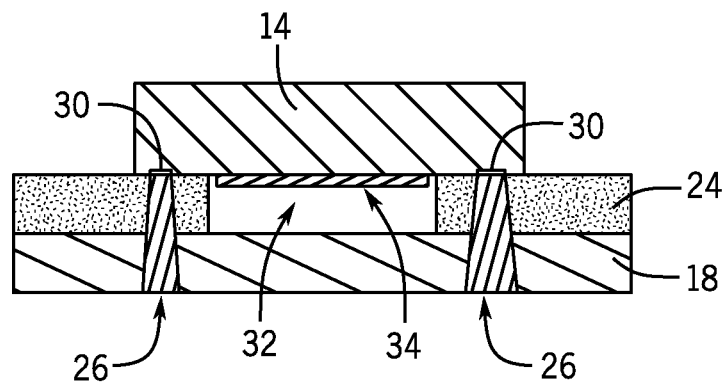
Figure 10:
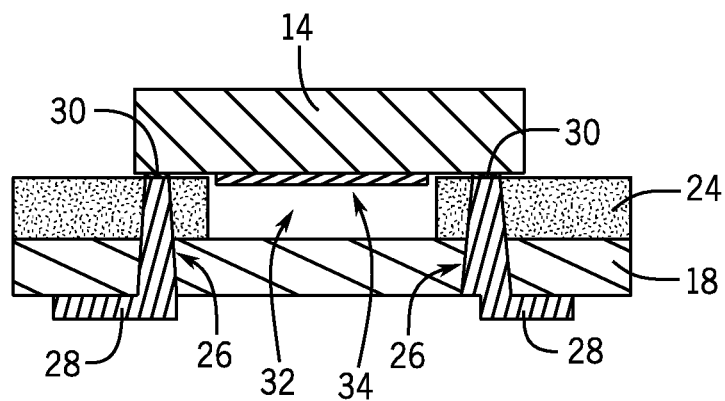
Figure 11A:
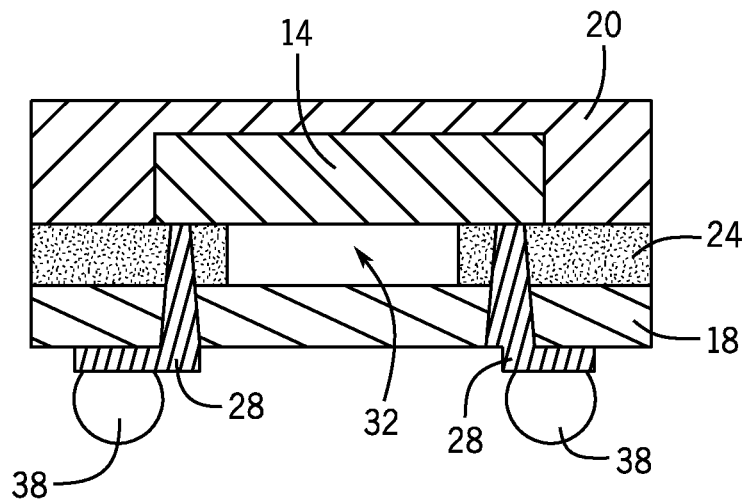
Figure 11B:
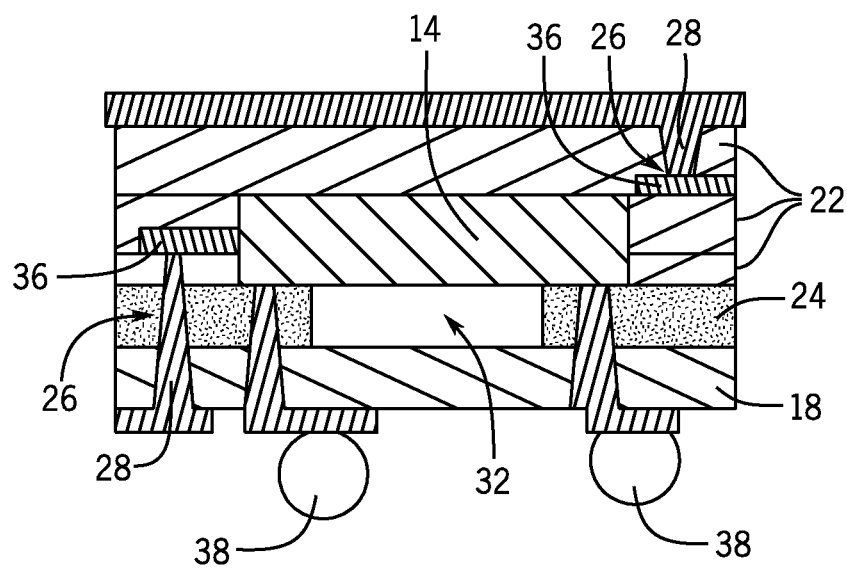

Referring now to FIG. 10 and FIGS. 11A and 11B, detailed views of the process steps for a technique of manufacturing a SAW filter package are provided, according to embodiments of the invention. The technique illustrated in FIGS. 6-11 is shown and described for packaging a SAW filter therein as, however, it is recognized that the described process is also applicable to manufacturing a package that embeds a BAW filter therein.

Figure 6:
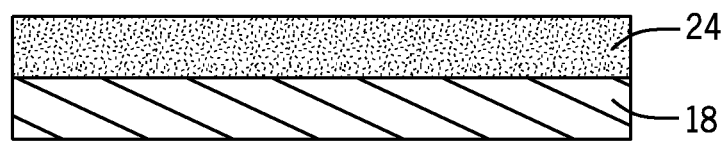
FIGS. 6-10 and FIGS. 11A and 11B are schematic cross-sectional side views of a single, discrete SAW filter package during various stages of a manufacturing/build-up process according to embodiment(s) of the invention.

Referring to FIG. 6, the build-up process of the package begins with the providing of an initial dielectric layer 18 that is in the form of a lamination or film. According to embodiments of the invention, the dielectric layer 18 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material.

Figure 7:
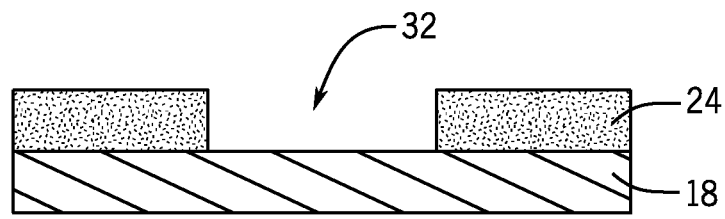

As shown in FIG. 7, an adhesive material 24 is next applied onto the dielectric layer 18 that provides for securing of a SAW filter to the dielectric layer 18. In order to provide for proper accommodation and operation of the SAW filter within the package, adhesive material 24 is applied or processed in a manner that provides a cavity 32 therein that will be positioned adjacent an active area of the SAW filter. According to one embodiment, the cavity 32 is formed by application of a continuous layer of adhesive material 24 and a subsequent laser ablation of the adhesive in the area adjacent where the active area of the SAW filter is to be positioned. According to another embodiment, the cavity 32 is formed via a selective application of adhesive material 24 onto dielectric layer 18, such as may be performed by an ink jet-type application of adhesive onto dielectric layer 18, with no adhesive being applied in the area adjacent where the active area of the SAW filter is to be positioned.

Figure 8:
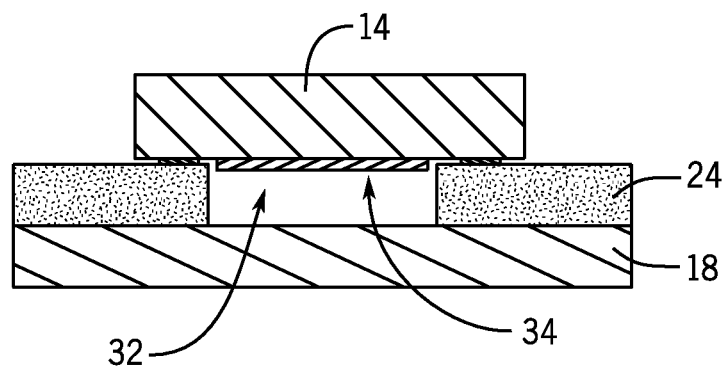

In a next step of the build-up process, and as shown in FIG. 8, the SAW filter 14 is placed and attached face down (i.e., active side down) onto the adhesive 24 to secure the filter onto dielectric layer 18. The SAW filter 14 is positioned such that the IDTs or "active area" 34 of the SAW filter 14 are adjacent the air cavity 32 and I/O pads 30 of the SAW filter 14 are outside of the region covered by air cavity 32. A curing step is then performed to cure the adhesive 24 and secure the SAW filter 14 to the adhesive 24 and to the dielectric layer 18.

Referring now to FIG. 9, upon securing of the SAW filter 14 to the adhesive 24 and to the dielectric layer 18, a plurality of vias 26 is formed through the dielectric layer 18 and adhesive layer 24 to the I/O pads 30 of the SAW filter 14. The vias 26 are blind vias formed down to the I/Os pads 30 of the SAW filter 14 for forming an electrical connection thereto, such as by using an alignment drilling to see the SAW filter. According to embodiments of the invention, the vias 26 may be formed by way of a laser ablation or laser drilling process, plasma etching, photo-definition, or mechanical drilling processes. Once the vias 26 have been formed down to I/O pads 30 of SAW filter 14, and upon completion of a cleaning of the vias 26 (such as through a reactive ion etching (RIE) desoot process), metal interconnects 28 are then formed, as shown in FIG. 10. According to one embodiment, the metal interconnects 28 may be formed through a combination of sputtering and electroplating applications, although it is recognized that other methods of metal deposition (e.g., electroless or electrolytic plating) could also be used. For example, a titanium or palladium adhesion layer and copper seed layer may first be applied in vias 26 by way of a sputtering or electroless plating process, followed by an electroplating process that fills the vias 26 and increases a thickness of (i.e., "plating up") the copper to a desired level. In one embodiment, a patterning and etching is then subsequently performed on the applied copper to form interconnects 28 having a desired shape. While application of a continuous copper layer and subsequent patterning and etching of the continuous copper layer is described here for forming interconnects 28, it is recognized that patterning and plating of the interconnects 28 via a semi-additive plating process could instead be employed to form the interconnects 28.

In a next step of the build-up process, additional process steps are performed in order to embed the SAW filter 14 within the package 10, 12. In one embodiment, and as shown in FIG. 11A, a dielectric encapsulant 20, such as a polymeric encapsulant or epoxy, is applied so as to surround the SAW filter 14. The dielectric encapsulant 20 is then formed to present a level or planar back surface for the packaged module 10 that enables, for example, shielding (not shown) to be provided on a back surface of the package. In another embodiment, and as shown in FIG. 11B, additional dielectric layers 22 are stacked onto initial dielectric layer 18 to a height/thickness that embeds the SAW filter 14. In the example provided in FIG. 11B, three additional dielectric layers 22 are provided and positioned such that SAW filter 14 is embedded by the dielectric layers. According to one embodiment of the invention, one or more of the additional dielectric layers 22 includes an opening/cut-out 40 formed therein to receive the SAW filter 14 and accommodate positioning of the layer(s) 22 thereabout. Alternatively, it is recognized that segments of dielectric sheets 22 could be placed about the SAW filter 14 to accommodate inclusion thereof. Ideally, the additional layers 22—once stacked—equal the height/thickness of the SAW filter 14, such that a planar surface is provided to laminate subsequent layers 22 on the back side of the package 10, 12.

As further shown in FIGS. 11A and 11B, the build-up process also includes a step of forming I/O connections 38 on the package 10, 12 to enable surface mounting of the package to an external circuit or substrate, such as a printed circuit board (PCB) (not shown). According to an embodiment, the I/O connections 38 are provide as solder bumps (e.g., land grid array (LGA) or ball grid array (BGA) solder bumps) that are configured to be attached/affixed to the PCB to electrically couple the package 10, 12 to the PCB.

According to one embodiment, and as shown in FIG. 11B, additional features 36 such as an antenna, delay lines, a switching matrix, and/or a shielding layer may be formed in package 12 as part of the application of the additional dielectric layers 22. Such features 36 may be formed via a metallization (e.g., sputtering) performed on/between one or more of the additional dielectric layers 22. Additional vias 26 and metal interconnects 28 are formed in dielectric layer 20 and dielectric layers 22 to provide electrical connections to the features 36 (as required), with such vias 26 and interconnects 28 being formed in a similar fashion as those formed to the SAW filter 14.

The technique of manufacturing a SAW filter package illustrated in FIGS. 6-10 and FIGS. 11A and 11B may beneficially be performed via a POL build-up process that provides for the embedding of a SAW filter within a packaging structure and formation of electrical connections to the SAW filter using robust copper plated interconnects. The POL process allows the creation of the air cavity adjacent the SAW filter that enables proper operation of the SAW filter (without significant trade-offs in size, cost, or performance) and provides for shorter path lengths, better grounding, and redundant interconnects within the package structure, all resulting in superior RF performance.

While FIGS. 4-10, 11A, and 11B illustrate a discrete, single SAW filter package (and method of fabrication thereof), additional embodiments of the invention are directed to the integration of multiple SAW filters into different multichip modules—including multiple discrete SAW filter packages integrated into a single overall multichip package and multiple SAW filters packaged together in a single monolithic multichip module package. Such multichip modules may include other components as well, such as resistors, capacitors, MEMS switches or other switch types.

Figure 12:
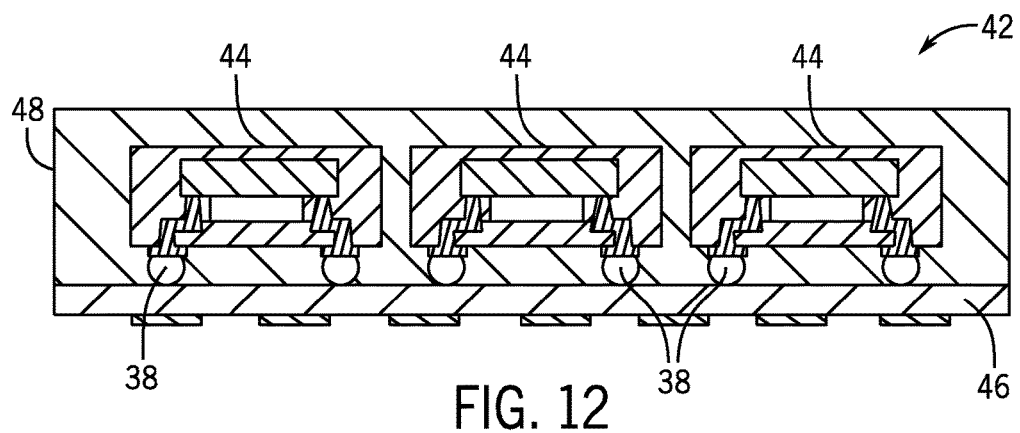
FIG. 12 is a schematic cross-sectional side view of a multichip package according to an embodiment of the invention.

Referring to FIG. 12, a multichip package 42 that integrates multiple discrete SAW filter packages 44 therein is shown, according to an embodiment. As illustrated in FIG. 12, the multichip package 42 includes three SAW filter packages 44 therein, although it is recognized that a greater or lesser number of SAW filter packages 44 could be included in the multichip package. Each of the SAW filter packages 44 may have a structure identical to one of the SAW filter package constructions previously shown and described in FIGS. 4 and 5. In packaging the multiple SAW filter packages 44 together in a single multichip package 42, the SAW filter packages 44 may each be first separately mounted to an external circuit or substrate 46, such as a PCB, via the I/O connections 38 provided on each SAW filter package 44. Upon mounting of the SAW filter packages 44 on the PCB 46, an encapsulation and underfill process may be performed to surround and package the discrete SAW filter packages 44 into a single multichip package. The encapsulant 48 is formed of a dielectric material (e.g., polymeric encapsulant or epoxy) that may be applied/formed so as to surround the SAW filter packages 44, so as to provide protection thereto and provide additional structural integrity to the multichip package 42.

Figure 13:
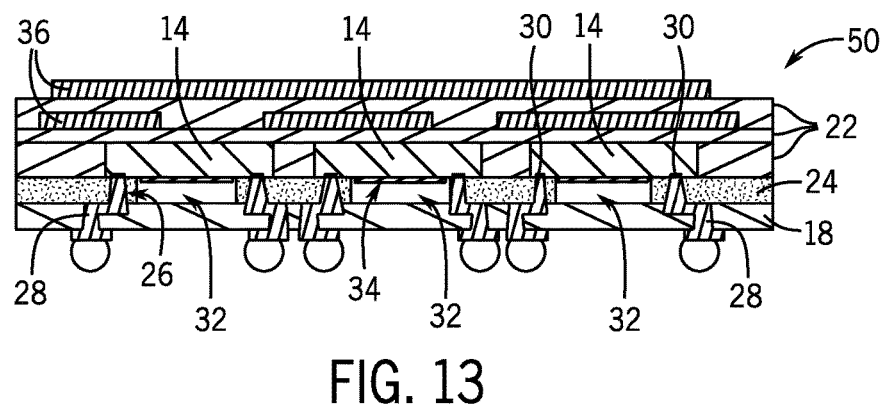
FIG. 13 is a schematic cross-sectional side view of a monolithic multichip package according to an embodiment of the invention.

Referring now to FIG. 13, a monolithic multichip package 50 that integrates multiple SAW filters 14 therein formed on a common dielectric substrate 18 is shown, according to one embodiment. As illustrated in FIG. 13, the monolithic multichip package 50 includes three SAW filters 14 therein, although it is recognized that a greater or lesser number of SAW filters 14 could be included in the package. The SAW filters 14 are all secured onto an initial dielectric layer 18 via an adhesive 24—with the adhesive 24 being applied/patterned to provide air cavities 32 therein. That is, as previously described, an air cavity or air gap 32 is provided in adhesive layer 24 adjacent the front surface of each SAW filter 14. According to one embodiment, the air cavities 32 are formed by application of a continuous layer of adhesive material 24 and a subsequent laser ablation of the adhesive in areas adjacent the active area 34 of the respective SAW filters 14. According to another embodiment, the air cavities 32 are formed via a selective application of adhesive material 24 onto dielectric layer 18, such as may be performed by an ink jet-type application of adhesive 24 onto dielectric layer 18, with the adhesive being applied such that no adhesive is present in areas adjacent the active area 34 of the respective SAW filters 14 in order to form the air cavities 32.

As shown in FIG. 13, a plurality of vias 26 are formed through the dielectric layer 18 and adhesive 24 down to SAW filters 14. Metal interconnects 28 are subsequently formed/patterned in the package 50 to provide electrical connections therein, with the metal interconnects 28 being formed in the vias 26 down to I/O pads 30 on the respective SAW filters 14 and out onto a surface of dielectric layer 18. It is recognized that the vias 26 and metal interconnects 28 may be formed as part of a POL fabrication process—such that the vias 26 to each of the SAW filters 14 may be formed as part of a common fabrication step and such that the metal interconnects 28 to each of the SAW filters 14 may be formed as part of a common fabrication step, thereby minimizing time and cost in forming connections to the SAW filters 14 in package 50.

In the embodiment of FIG. 13 it is seen that additional dielectric layers 22 are included in package 50—and are applied onto initial dielectric layer 18 and about/over SAW filters 14—in order to embed the SAW filters 14 within the package. While additional dielectric layers 22 are shown, it is recognized that an alternative embodiment of package 50 could utilize an encapsulant to embed SAW filters 14 rather than multiple additional dielectric layers. As shown in FIG. 13, additional features 36 such as an antenna, delay lines, a switching matrix, and/or a shielding layer may be formed in package 50. Such features may be formed via a metallization (e.g., sputtering) performed on/between one or more of the additional dielectric layers. Vias 26 and metal interconnects 28 are formed in dielectric layer 18 and dielectric layers 22 to provide electrical connections to the features 36 (as required), with such vias and interconnects being formed in a similar fashion as those formed to the SAW filters 14. While not shown in FIG. 13, it is recognized that additional passive devices or power semiconductor devices could also be incorporated into the monolithic multichip package 50—including resistors, capacitors, MEMs switches or other switch types—with the utilized POL fabrication process enabling inclusion of such components and the formation of electrical connections thereto in a time and cost effective fashion.

Beneficially, embodiments of the invention thus provide embedded filter device packages and methods of fabrication thereof that provide lower cost/complexity packaging, lower form factor, and higher integration. The filter package allows for formation of a filter package as part of an overall embedded filter module that also includes peripheral passive components, delay lines, antennas and switching matrices in the same package. Multiple filter devices may be incorporated into an overall multichip/multi-filter package via a standard POL packaging process in order to provide coverage of multiple frequency bands in the same module at a low cost and in a small form factor.

Therefore, according to one embodiment of the invention, a filter device package includes a first dielectric layer and an acoustic wave filter device attached to the first dielectric layer, the acoustic wave filter device comprising an active area and input/output (I/O) pads. The filter device package also includes an adhesive positioned between the first dielectric layer and the acoustic wave filter device to secure the first dielectric layer to the acoustic wave filter device, a plurality of vias formed through the first dielectric layer and the adhesive to the I/O pads of the acoustic wave filter device, and metal interconnects formed in the plurality of vias and mechanically and electrically coupled to the I/O pads of the acoustic wave filter device to form electrical interconnections thereto, wherein an air cavity is formed in the adhesive between the acoustic wave filter device and the first dielectric layer, in a location adjacent the active area of the acoustic wave filter device.

According to another embodiment of the invention, a method of manufacturing an embedded filter device package includes providing an initial dielectric layer having an adhesive layer on one surface thereof, the adhesive layer having a cavity therein that is free of adhesive material. The method also includes placing an acoustic wave filter device onto the adhesive layer so as to secure the acoustic wave filter device to the initial dielectric layer, the acoustic wave filter device being placed on the adhesive layer such that an active area of the acoustic wave filter device is adjacent to and aligned with the cavity in the adhesive layer. The method further includes forming a plurality of vias through the initial dielectric layer and the adhesive layer at locations aligned with input/output (I/O) pads of the acoustic wave filter device and forming metal interconnects in the plurality of vias and down to the I/O pads of the acoustic wave filter device so as to form electrical interconnections to the acoustic wave filter device.

According to yet another embodiment of the invention, a multichip filter device module package includes a plurality of discrete packaged acoustic wave filter devices, each of the plurality of discrete packaged acoustic wave filter devices further including a first dielectric layer and an acoustic wave filter device attached to the first dielectric layer, the acoustic wave filter device comprising an active area and input/output (I/O) pads. Each of the discrete packaged acoustic wave filter devices also includes an adhesive positioned between the first dielectric layer and the acoustic wave filter device to secure the first dielectric layer to the acoustic wave filter device, a plurality of vias formed through the first dielectric layer and the adhesive to the I/O pads of the acoustic wave filter device, metal interconnects formed in the plurality of vias and mechanically and electrically coupled to the I/O pads of the acoustic wave filter device to form electrical interconnections thereto, and input/output (I/O) connections formed on the metal interconnects on an outward facing surface of the first dielectric layer, wherein an air cavity is formed in the adhesive between the acoustic wave filter device and the first dielectric layer, in a location adjacent the active area of the acoustic wave filter device.

The multichip filter device module package also includes a circuit substrate on which each of the plurality of discrete packaged acoustic wave filter devices is mounted, the circuit substrate being electrically connected to the plurality of discrete packaged acoustic wave filter devices via the I/O connections thereon. The multichip filter device module package further includes an insulating substrate applied onto the circuit substrate and about the plurality of discrete packaged acoustic wave filter devices to embed the plurality of discrete packaged acoustic wave filter devices therein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A filter device package comprising:
   a first dielectric layer;
   an acoustic wave filter device attached to the first dielectric layer, the acoustic wave filter device comprising an active area and input/output (I/O) pads;
   an adhesive positioned between the first dielectric layer and the acoustic wave filter device to secure the first dielectric layer to the acoustic wave filter device;
   a plurality of vias formed through the first dielectric layer and the adhesive to the I/O pads of the acoustic wave filter device;
   metal interconnects formed in the plurality of vias and mechanically and electrically coupled to the I/O pads of the acoustic wave filter device to form electrical interconnections thereto; and
   a plurality of additional dielectric layers stacked onto the first dielectric layer and the adhesive, the plurality of additional dielectric layers being stacked so as to cover back and side surfaces of the acoustic wave filter device and embed the acoustic wave filter device within the filter device package;
   wherein an air cavity is formed in the adhesive between the acoustic wave filter device and the first dielectric layer, in a location adjacent the active area of the acoustic wave filter device; and
   wherein one or more of the plurality of additional dielectric layers includes at least one via formed therethrough.

2. The filter device package of claim 1 further comprising a dielectric encapsulant applied onto the adhesive layer and over back and side surfaces of the acoustic wave filter device, so as to embed the acoustic wave filter device within the filter device package.

3. The filter device package of claim 1 further comprising at least one of an antenna, delay lines, a switching matrix, and/or a shielding layer metalized onto or between the plurality of additional dielectric layers.

4. The filter device package of claim 3 wherein electrical connections are made to one or more of the at least one of the antenna, delay lines, switching matrix, and/or shielding layer by the metal interconnects or by additional metal interconnects positioned on one or more of the additional dielectric layers and in the at least one via formed through the one or more of the plurality of additional dielectric layers.

5. The filter device package of claim 1 further comprising one or more additional acoustic wave filter devices attached to the first dielectric layer via the adhesive, wherein an air cavity is formed in the adhesive between each of the additional acoustic wave filter devices and the first dielectric layer, at locations adjacent the active area of each respective additional acoustic wave filter device.

6. The filter device package of claim 5 further comprising:
   a plurality of vias formed through the first dielectric layer and the adhesive to I/O pads of each of the additional acoustic wave filter devices; and
   metal interconnects formed in the plurality of vias and mechanically and electrically coupled to the I/O pads of each of the additional acoustic wave filter devices to form electrical interconnections thereto.

7. The filter device package of claim 1 wherein the first dielectric layer comprises a film, panel, or sheet of dielectric material.

8. The filter device package of claim 1 wherein the metal interconnects comprise plated copper power overlay (POL) interconnects providing electrical connections to the acoustic wave filter device.

9. The filter device package of claim 1 wherein the acoustic wave filter device comprises one of a surface acoustic wave (SAW) filter and a bulk acoustic wave (BAW) filter.

10. A method of manufacturing an embedded filter device package comprising:
    providing an initial dielectric layer having an adhesive layer on one surface thereof, the adhesive layer having a cavity therein that is free of adhesive material;
    placing an acoustic wave filter device onto the adhesive layer so as to secure the acoustic wave filter device to the initial dielectric layer, the acoustic wave filter device being placed on the adhesive layer such that an active area of the acoustic wave filter device is adjacent to and aligned with the cavity in the adhesive layer;
    forming a plurality of vias through the initial dielectric layer and the adhesive layer at locations aligned with input/output (I/O) pads of the acoustic wave filter device;
    forming metal interconnects in the plurality of vias and down to the I/O pads of the acoustic wave filter device so as to form electrical interconnections to the acoustic wave filter device;
    applying a plurality of additional dielectric layers onto the initial dielectric layer and the adhesive in a stacked arrangement, the plurality of additional dielectric layers being stacked so as to embed the acoustic wave filter device; and
    forming at least one via through one or more of the plurality of additional dielectric layers.

11. The method of claim 10 further comprising over molding the acoustic wave filter device with a dielectric encapsulant material to embed the acoustic wave filter device.

12. The method of claim 11 further comprising:
    selectively applying and patterning metallic material on one or more of the plurality of additional dielectric layers to form at least one of an antenna, delay lines, a switching matrix, and a shielding layer; and
    forming additional metal interconnects in the at least one via and down to one or more of the at least one of the antenna, delay lines, switching matrix, and shielding layer, to provide an electrical connection thereto.

13. The method of claim 12 further comprising placing one or more additional acoustic wave filter devices onto the adhesive layer so as to secure the one or more acoustic wave filter devices to the initial dielectric layer, with the one or more acoustic wave filter devices being placed on the adhesive layer such that an active area of each of the one or more acoustic wave filter devices is adjacent to and aligned with additional cavities formed in the adhesive layer that are free of adhesive material.

14. The method of claim 13 further comprising:
forming a plurality of vias through the initial dielectric layer and the adhesive layer to I/O pads of each of the one or more additional acoustic wave filter devices; and
forming metal interconnects formed in the plurality of vias that are mechanically and electrically coupled to the I/O pads of each of the one or more additional acoustic wave filter devices to form electrical interconnections thereto.

15. The method of claim 11 wherein the metal interconnects comprise plated copper power overlay (POL) interconnects formed via a sputtering and patterning and etching process.

16. The method of claim 10 wherein, in providing the initial dielectric layer with the adhesive layer on one surface thereof, the method further comprises:
applying the adhesive layer onto the initial dielectric layer as a continuous layer of adhesive material; and
removing adhesive material from the adhesive layer in an area thereof to be positioned adjacent to and aligned with the active area of the acoustic wave filter device so as to form the cavity therein.

17. The method of claim 10 wherein, in providing the initial dielectric layer with the adhesive layer on one surface thereof, the method further comprises selectively applying the adhesive layer onto the initial dielectric layer in a patterned fashion so as to form the cavity therein, and such that the cavity in the adhesive layer will be positioned adjacent to and aligned with the active area of the acoustic wave filter device to be applied to the adhesive layer.

18. A multichip filter device module package comprising:
a plurality of discrete packaged acoustic wave filter devices, each of the plurality of discrete packaged acoustic wave filter devices comprising:
a first dielectric layer;
an acoustic wave filter device attached to the first dielectric layer, the acoustic wave filter device comprising an active area and input/output (I/O) pads;
an adhesive positioned between the first dielectric layer and the acoustic wave filter device to secure the first dielectric layer to the acoustic wave filter device;
a plurality of vias formed through the first dielectric layer and the adhesive to the I/O pads of the acoustic wave filter device;
metal interconnects formed in the plurality of vias and mechanically and electrically coupled to the I/O pads of the acoustic wave filter device to form electrical interconnections thereto; and
input/output (I/O) connections formed on the metal interconnects on an outward facing surface of the first dielectric layer;
wherein an air cavity is formed in the adhesive between the acoustic wave filter device and the first dielectric layer, in a location adjacent the active area of the acoustic wave filter device;
a circuit substrate on which each of the plurality of discrete packaged acoustic wave filter devices is mounted, the circuit substrate being electrically connected to the plurality of discrete packaged acoustic wave filter devices via the I/O connections thereon; and
an insulating substrate applied onto the circuit substrate and about the plurality of discrete packaged acoustic wave filter devices to embed the plurality of discrete packaged acoustic wave filter devices therein.

19. The packaged electronics module of claim 18 wherein the insulating substrate comprises a dielectric encapsulate that surrounds and underfills the plurality of discrete packaged acoustic wave filter devices to provide electrical insulation thereto and structural integrity to the multichip filter device module package.

* * * * *